(12) United States Patent
Davidson

(10) Patent No.: US 9,819,337 B2
(45) Date of Patent: Nov. 14, 2017

(54) SEMICONDUCTOR SWITCHING CIRCUIT

(71) Applicant: General Electric Technology GmbH, Baden (CH)

(72) Inventor: Colin Charnock Davidson, Staffordshire (GB)

(73) Assignee: GENERAL ELECTRIC TECHNOLOGY GMBH (CH)

(*) Notice: Subject to any disclaimer, the term of this patent is extended or adjusted under 35 U.S.C. 154(b) by 0 days.

(21) Appl. No.: 14/898,098

(22) PCT Filed: Jun. 10, 2014

(86) PCT No.: PCT/EP2014/062043
§ 371 (c)(1),
(2) Date: Dec. 11, 2015

(87) PCT Pub. No.: WO2014/198730
PCT Pub. Date: Dec. 18, 2014

(65) Prior Publication Data
US 2016/0156344 A1 Jun. 2, 2016

(30) Foreign Application Priority Data
Jun. 14, 2013 (EP) .................................... 13172036

(51) Int. Cl.
G05F 3/16 (2006.01)
H03K 17/16 (2006.01)
(Continued)

(52) U.S. Cl.
CPC ............ H03K 17/161 (2013.01); H02M 5/45 (2013.01); H02M 5/458 (2013.01); H02M 7/68 (2013.01);
(Continued)

(58) Field of Classification Search
CPC ...... H02M 1/4216; H02M 5/45; H02M 5/458; H02M 1/08; H03K 17/161
(Continued)

(56) References Cited

U.S. PATENT DOCUMENTS 4,161,022 A    7/1979  Kanazawa et al.
4,482,946 A   11/1984  Bhagwat
(Continued)

FOREIGN PATENT DOCUMENTS

EP    2 955 837 A1    12/2015
EP    2 955 838 A1    12/2015
(Continued)

OTHER PUBLICATIONS

International Search Report and Written Opinion, PCT/EP2014/062043, Alstom Technology Ltd, 7 pages (dated Aug. 12, 2014).
(Continued)

Primary Examiner — Rajnikant Patel
(74) Attorney, Agent, or Firm — GE Global Patent Operation; Scott R. Stanley

(57) ABSTRACT

A semiconductor switching circuit includes a main current branch which includes at least one main semiconductor switching element and through which current flows in a first direction when the or each main semiconductor switching element is switched on. The semiconductor switching circuit also includes an auxiliary current branch that is connected in parallel with the main current branch. The auxiliary current branch includes at least one auxiliary semiconductor switching element. One or more control units are configured to switch on the or each auxiliary semiconductor switching element as the or each main semiconductor switching element is switched on to selectively create an alternative current path via the auxiliary current branch whereby current flowing in the first direction through the main current branch
(Continued)

is diverted instead to flow through the alternative current path to reduce the rate of change of current flowing through the or each main semiconductor switching element.

17 Claims, 4 Drawing Sheets

(51) Int. Cl.
| | |
|---|---|
| *H03K 17/0814* | (2006.01) |
| *H03K 17/10* | (2006.01) |
| *H02M 5/45* | (2006.01) |
| *H02M 5/458* | (2006.01) |
| *H02M 7/68* | (2006.01) |
| *H03K 17/66* | (2006.01) |
| *H03K 17/687* | (2006.01) |

(52) U.S. Cl.
CPC ..... *H03K 17/08144* (2013.01); *H03K 17/105* (2013.01); *H03K 17/16* (2013.01); *H03K 17/66* (2013.01); *H03K 17/687* (2013.01)

(58) Field of Classification Search
USPC .......... 363/16–17, 37, 45, 49, 54, 56.01, 65, 363/125–132; 361/18, 141; 323/207, 323/222, 224, 225, 235, 266, 300
See application file for complete search history.

(56) References Cited

U.S. PATENT DOCUMENTS

| | | | | |
|---|---|---|---|---|
| 4,500,934 | A * | 2/1985 | Kinsinger | H01H 9/542 361/13 |
| 4,642,476 | A * | 2/1987 | Honig | H03K 3/55 124/3 |
| 4,697,129 | A | 9/1987 | Enami et al. | |
| 4,697,219 | A | 9/1987 | Mitsuoka | |
| 4,811,190 | A * | 3/1989 | Keir | H02J 9/061 307/110 |
| 4,878,010 | A * | 10/1989 | Weber | H02M 5/257 323/300 |
| 5,463,344 | A | 10/1995 | Temple | |
| 5,473,526 | A * | 12/1995 | Svensson | G05F 1/565 307/109 |
| 5,570,057 | A * | 10/1996 | Palara | H03K 17/567 327/108 |
| 5,923,513 | A * | 7/1999 | Pelly | H03K 17/08148 361/90 |
| 6,434,029 | B1 | 8/2002 | Cyr et al. | |
| 6,639,767 | B2 * | 10/2003 | Ito | H02M 1/08 361/141 |
| 6,927,556 | B2 | 8/2005 | Hosotani et al. | |
| 8,305,777 | B2 | 11/2012 | Rittiger | |
| 8,711,591 | B2 | 4/2014 | Jonsson et al. | |
| 8,737,096 | B2 | 5/2014 | Asplund | |
| 8,867,242 | B2 | 10/2014 | Clare et al. | |
| 2002/0057540 | A1 | 5/2002 | Ito et al. | |
| 2008/0074816 | A1 | 3/2008 | Omaru | |

FOREIGN PATENT DOCUMENTS

| | | |
|---|---|---|
| JP | H08-195664 A | 7/1996 |
| WO | WO-2010/097113 A1 | 9/2010 |
| WO | WO-2011/042596 A1 | 4/2011 |
| WO | WO-2014/198730 A1 | 12/2014 |
| WO | WO-2014/198734 A1 | 12/2014 |
| WO | WO-2015/189214 A1 | 12/2015 |
| WO | WO-2015/189215 A1 | 12/2015 |

OTHER PUBLICATIONS

International Preliminary Report on Patentability, PCT/EP2014/062043, Alstom Technology Ltd, 6 pages (dated Sep. 14, 2015).
Written Opinion of the International Preliminary Examining Authority, PCT/EP2014/062043, Alstom Technology Ltd, 6 pages (dated May 13, 2015).
English-language machine translation of JP H08-195664, Fuji Electric Co. Ltd. (Jul. 30, 1996).
Notice of Allowance issued in connection with related U.S. Appl. No. 14/898,095 dated Jul. 5, 2017.

* cited by examiner

SEMICONDUCTOR SWITCHING CIRCUIT

CROSS REFERENCE TO RELATED APPLICATIONS

The present application is a National Stage of International Application No. PCT/EP2014/062043, filed Jun. 10, 2014, which claims priority to European Application No. 13172036, filed Jun. 14, 2013, which is incorporated herein by reference in its entirety.

This invention relates to a semiconductor switching circuit and a semiconductor switching string, each of which is for use in a high voltage direct current (HVDC) power converter.

In power transmission networks alternating current (AC) power is typically converted to direct current (DC) power for transmission via overhead lines and/or under-sea cables. This conversion removes the need to compensate for the AC capacitive load effects imposed by the transmission line or cable and reduces the cost per kilometer of the lines and/or cables, and thus becomes cost-effective when power needs to be transmitted over a long distance.

HVDC power converters are used to convert AC power to DC power. Semiconductor switching elements, such as thyristors, are a key component of HVDC power converters, and act as controlled rectifiers to convert AC power to DC power and vice versa.

According to a first aspect of the invention there is provided a semiconductor switching circuit, for use in a HVDC power converter, comprising:

a main current branch including at least one main semiconductor switching element and through which current flows in a first direction when the or each main semiconductor switching element is switched on; and an auxiliary current branch connected in parallel with the main current branch, the auxiliary current branch including at least one auxiliary semiconductor switching element, the or each auxiliary semiconductor switching element having a control unit operatively connected therewith, the or each control unit being configured to switch on the or each auxiliary semiconductor switching element in the auxiliary current branch as the or each main semiconductor switching element is switched on to selectively create an alternative current path via the auxiliary current branch whereby current flowing in the first direction through the main current branch is diverted to flow through the alternative current path to reduce the rate of change of current flowing through the or each main semiconductor switching element immediately after the or each said main semiconductor switching element is switched on.

The inclusion of one or more control units, the or each of which is configured to create an alternative current path via the auxiliary current branch, whereby current flowing through the main current branch is diverted to flow through the alternative current path to reduce the rate of change of current flowing through the or each main semiconductor switching element, allows the current arising from external stray capacitances, e.g. within a HVDC power converter, to be diverted through the alternative current path (rather than through the main current branch and the or each main semiconductor switching element therein) where it can be safely discharged without damaging the or each main semiconductor switching element. Such a configuration therefore obviates the need for a large saturating inductor (or di/dt reactor), which would otherwise be required to compensate for the relatively low tolerance of rate of change of current that is an inherent performance limitation of some main semiconductor switching elements such as, for example, thyristors.

Moreover, having the or each control unit configured to switch on the or each auxiliary semiconductor switching element as the or each main semiconductor switching element is switched on, e.g. configured to switch on the or each auxiliary semiconductor switching element at the same time or just before the or each main semiconductor switching element is switched on, desirably allows the semiconductor switching circuit of the invention to compensate for inherent limitations in the performance of the or each main semiconductor switching element when those limitations are at their most acute.

More particularly, the semiconductor switching circuit of the invention is able to reduce the rate of change of current flowing through the or each main semiconductor switching element when the or each such element is first switched on and exposed to a large change in current. In this regard the or each main semiconductor switching element is initially in a forward-biased condition, i.e. it is initially switched off but experiencing a positive voltage. Under such conditions the or each main semiconductor switching element will allow current to flow therethrough, and hence allow current to flow in the first direction through the main current branch, following receipt of a turn-on signal, i.e. when it is switched on.

Preferably the or each control unit is configured to switch on the or each auxiliary semiconductor switching element in response to generation of a turn-on signal for the or each main semiconductor switching element.

Having one or more control units so configured helps to ensure that the or each auxiliary semiconductor switching element is always switched on as the or each main semiconductor switching element is switched on (so as to permit the safe discharge of any current arising from external stray capacitances), which may not occur if switching on of the or each auxiliary semiconductor switching element is determined, e.g. simply by the voltage across one or more main semiconductor switching elements exceeding a given threshold.

Optionally the or each control unit is configured subsequently to switch the or each auxiliary semiconductor switching element off to control the amount of current diverted to flow through the alternative current path.

Such control is desirable so as not to create a further problem while attempting to alleviate the difficulties associated with the inherent performance limitations of the or each main semiconductor switching element.

Optionally the or each auxiliary semiconductor switching element is or includes a transistor.

Transistors, especially those incorporating wide-band-gap semiconducting materials, have desirable high voltage performance characteristics. In addition some are able to tolerate a high pulse, i.e. peak, current which is useful in allowing the semiconductor switching circuit of the invention to compensate for the various further shortfalls of a main semiconductor switching element when it is operating in a forward-biased condition.

The or each auxiliary switching element may also be or include a thyristor.

Thyristors typically have voltage and current performance characteristics that are even better than those of transistors, and so they are again well-suited to allowing the semiconductor switching circuit of the invention to compensate for various performance shortfalls of a main semiconductor switching element when it is operating in a forward-biased condition.

In this regard thyristors typically can be optimised either for low conduction losses or high switching speed, but generally not both. As such the thyristor included in the or each auxiliary semiconductor switching element can be optimised for high switching speeds, while the or each main semiconductor switching element may include a thyristor that is selected according to its low conduction losses, so as to permit the optimisation of both such thyristors.

Preferably the auxiliary current branch includes a current limiting element connected in series with the or each auxiliary semiconductor switching element.

Such a current limiting element facilitates, e.g. the discharge of the current arising from any external stray capacitances.

In a preferred embodiment of the invention the or each control unit is configured to switch on the or each auxiliary semiconductor switching element to selectively create an alternative current path via the auxiliary current branch whereby current flowing in the first direction through the main current branch is diverted to flow through the alternative current path to reduce the rate of change of voltage appearing across the or each main semiconductor switching element.

The inclusion of one or more such control units which is or are additionally configured to reduce the rate of change of voltage appearing across the or each main semiconductor switching element, permits the aforementioned reduction in size of the further remedial component, i.e. the saturating inductor, without exposing a further inherent performance limitation of many semiconductor switching elements, namely a sensitivity to high rates of change of voltage.

Optionally the or each control unit is configured to switch on the or each parallel connected auxiliary semiconductor switching element when the rate of change of voltage appearing across one or more main semiconductor switching element exceeds a predetermined threshold to reduce the rate of change of voltage appearing across the or each main semiconductor switching element.

Such configuration of the or each control unit results in the alternative current path being created at a point in time which helps to ensure that the main semiconductor switching element is not exposed to an unacceptably high rate of change of voltage.

In another preferred embodiment of the invention the main current branch includes a single main semiconductor switching element having first and second connection terminals and the auxiliary current branch is connected between the first and second connection terminals whereby the main and auxiliary current branches together define a semiconductor switching assembly.

Such an arrangement allows the or each auxiliary semiconductor switching element in the auxiliary current branch to share any voltage grading circuitry associated with the single main semiconductor switching element, and/or share a power supply with the single main semiconductor switching element.

The auxiliary current branch may include a single auxiliary semiconductor switching element.

In still further embodiments of the invention the auxiliary current branch may include a plurality of series-connected auxiliary semiconductor switching elements.

The foregoing arrangements permit a tailoring of the configuration of the auxiliary current branch according to the performance rating of available auxiliary semiconductor switching elements.

The main current branch may include a main string of series-connected main semiconductor switching elements, the main string having an upstream connection terminal at an upstream end thereof and a downstream connection terminal at a downstream end thereof, the auxiliary current branch is connected between the upstream and downstream connection terminals of the main string, and the auxiliary current branch includes an auxiliary string of series-connected auxiliary semiconductor switching elements.

Main and auxiliary current branches configured in such a manner provides considerable flexibility in tailoring the voltage ratings of the auxiliary semiconductor switching elements to the voltage ratings of the main semiconductor switching elements, e.g. an auxiliary string including four 12 kV auxiliary semiconductor switching elements, i.e. a total voltage rating of 48 kV, could be connected in parallel with a main string including six 8 kV main semiconductor switching elements, i.e. an identical total voltage rating of 48 kV.

Such a configuration is also potentially more compact than existing semiconductor switching circuit topologies.

According to another aspect of the invention there is provided a semiconductor switching string, for use in a HVDC power converter, comprising a plurality of series-connected semiconductor switching assemblies as described hereinabove.

Such a semiconductor switching string desirably supports the switching of a larger voltage than is possible by a single such semiconductor switching assembly.

There now follows a brief description of preferred embodiments of the invention, by way of non-limiting example, with reference to the accompanying drawings in which:

FIG. 2(*b*) illustrates the reduction in the rate of change of current flowing through a main semiconductor switching element which forms part of the semiconductor switching circuit shown in FIG. 1;

Figure 1:
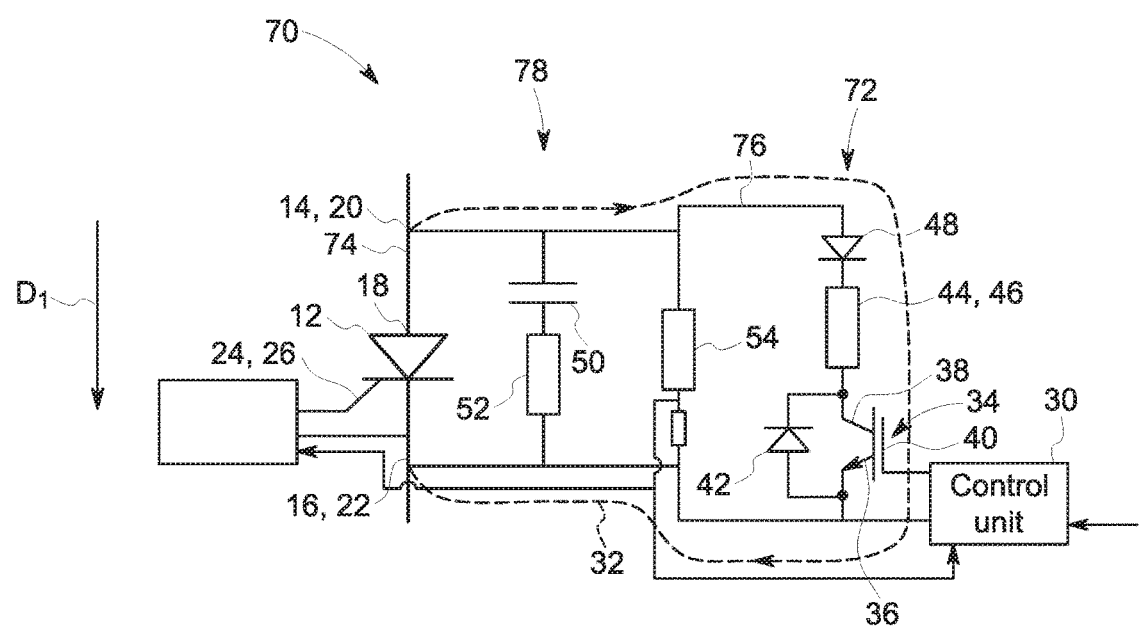
FIG. 1 shows a schematic view of a semiconductor switching circuit according to a first embodiment of the invention.

A semiconductor switching circuit according to a first embodiment of the invention is shown in FIG. 1, and is designated generally by reference numeral 70.

The semiconductor switching circuit 70 has a first main current branch 74 which includes a single main semiconductor switching element 12 that has first and second connection terminals 14, 16. In the embodiment shown the main semiconductor switching element 12 is a main thyristor 18, although in other embodiments of the invention a different main semiconductor switching element may be used such as a diode, Light-Triggered Thyristor (LTT), Gate Turn-Off thyristor (GTO), Gate Commutated Thyristor (GCT) or Integrated Gate Commutated Thyristor (IGCT). Preferably the main semiconductor switching element 12 is optimised for lowest conduction (on-state) losses at the expense of other parameters such as turn-on di/dt capability, turn-off characteristics and off-state dv/dt capability.

The main thyristor 18 shown includes an anode 20 which defines the first connection terminal 14, a cathode 22 which defines the second connection terminal 16, and a gate 24 that defines a control terminal 26 via which the main thyristor 18 may be switched on.

When the main thyristor 18 is so switched on current flows through the first main current branch 74, i.e. through the main thyristor 18, in a first direction $D_1$ from the first connection terminal 14 to the second connection terminal 16, i.e. from the anode 20 to the cathode 22.

The main thyristor 18 is, however, a naturally commutated switching element which means that while it can be switched on via its gate control terminal 26, it can only be turned off by arranging for the circuit in which it is located to force the current flowing through it to fall to zero and then maintaining a period, typically some few hundred microseconds, during which the main thyristor 18 is reverse-biased, i.e. a negative voltage is applied between its first and second terminals 14, 16. This is in contrast to some thyristor derivatives such as the GTO and IGCT mentioned above that are self-commutated whereby they can be both switched on and switched off via their gate control terminal.

The semiconductor switching circuit 70 also includes a first auxiliary current branch 76 which is connected between the first and second connection terminals 14, 16 so as to lie in parallel with the first main current branch 74. In this manner the main and auxiliary current branches together define a first semiconductor switching assembly 78.

The first auxiliary current branch 76 includes a single auxiliary semiconductor switching element 72 which is electrically connected between the first and second connection terminals 14, 16 of the main thyristor 18. The said single auxiliary semiconductor switching element 72 has a control unit 30 that is operatively connected therewith. The control unit 30 is configured to switch on the auxiliary semiconductor switching element 72 to selectively create a first alternative current path 32 via the first auxiliary current branch 76, i.e. between the first and second connection terminals 14, 16.

More particularly the auxiliary semiconductor switching element 72 is connected in parallel with the main semiconductor switching element 12, i.e. the main thyristor 18, such that when the auxiliary semiconductor switching element 72 is switched on the resulting alternative current path 32 allows current to flow via the first auxiliary current branch 76 in the first direction $D_1$ from the first connection terminal 14 to the second connection terminal 16 of the main thyristor 18.

In the embodiment shown the auxiliary semiconductor switching element 72 includes a transistor 34 which has an emitter 36 that is connected to the second connection terminal 16 of the main thyristor 18, a collector 38 that is connected to the first connection terminal 14 of the main thyristor 18, and a base 40 that is connected to the control unit 30.

The transistor 34 shown in FIG. 1 is an n-channel insulated-gate bipolar transistor (IGBT), although many other transistors may also be used such as, for example, a bipolar junction transistor (BJT), a metal-oxide-semiconductor field-effect transistor (MOSFET), or a junction gate field-effect transistor (JFET). A transistor assembly, such as a MOSFET-JFET cascode circuit incorporating a super-cascode arrangement of 50V MOSFETs and a series string of 1200V SiC JFETs, or a direct series connection of low voltage MOSFETs or IGBTs, may also be used. In any event the transistor 34 shown has a relatively high voltage rating of approximately 9 kV to 10 kV, and a relatively high pulse current rating of a few hundred amps, but a relatively low average current rating of less than 1 amp.

The transistor 34 has an anti-parallel diode 42 connected thereacross which protects the transistor 34 from reverse voltages while the main thyristor 18 is reverse-biased. In other embodiments of the invention (not shown) the separate anti-parallel diode 42 could be omitted and instead use made of an intrinsic body-diode which is included within some transistors.

In still further embodiments of the invention the first auxiliary current branch 76 may include a plurality of series-connected auxiliary semiconductor switching elements 72, each of which may have a respective individual control unit operatively connected therewith, or each of which may share a single control unit that is operatively connected with each of them.

The first auxiliary current branch 76 shown in FIG. 1 also includes an optional current limiting element 44, in the form of a resistor 46, which is connected in series with the transistor 34 and anti-parallel diode 42 combination mentioned above.

The first auxiliary current branch 76 also additionally includes a further, series-connected diode 48 which is arranged to permit the flow of current through the first alternative current path 32 in the same direction as through the transistor 34, i.e. in the first direction $D_1$. The further, series-connected diode 48 is included, in conjunction with the anti-parallel diode 42, to protect the transistor 34 from reverse voltages while the main thyristor 18 is reverse-biased.

In other embodiments of the invention in which the single auxiliary semiconductor switching element 72, i.e. the transistor 34, is capable of withstanding reverse voltage (while the main semiconductor switching element 12, i.e. the main thyristor 18, is reverse-biased the anti-parallel diode 42 and the series-connected diode 48 may be omitted.

As well as having the first auxiliary current branch 76 connected in parallel therewith, the first main current branch 74, i.e. the main thyristor 18, also has a damping circuit (which includes a damping capacitor 50 and a damping resistor 52), as well as a further resistor 54, connected in parallel therewith.

The pulse current rating of the transistor 34 in the auxiliary semiconductor switching element 72 of the first semiconductor switching circuit 70, i.e. the first semiconductor switching assembly 78, is sufficiently high, e.g. a few hundred amps, and so the control unit 30 is configured to switch on the auxiliary semiconductor switching element 72 as the main thyristor 18 is switched on.

Figure 2A:
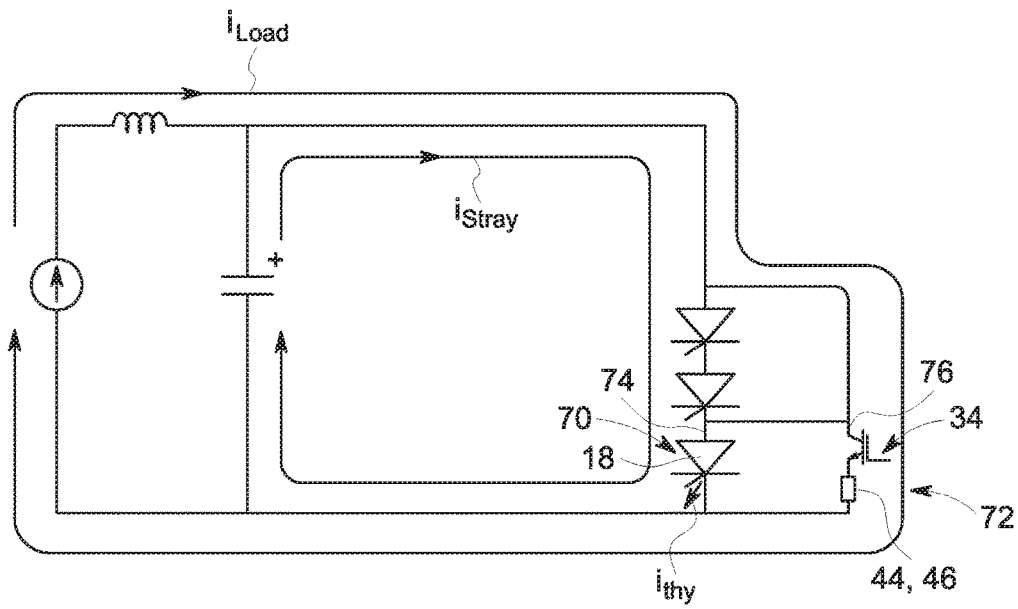
FIG. 2(*a*) illustrates schematically the flow of a stray capacitance discharge current through the semiconductor switching circuit shown in FIG. 1.

More particularly, the control unit 30 is configured to switch on the transistor 34 in the auxiliary semiconductor switching element 72 in response to generation of a turn-on signal for the main thyristor 18, such that the transistor 34 is switched on about 10 to 20 μs before the main thyristor 18 is switched on, i.e. just before the main thyristor 18 is switched on. This causes any stray capacitance discharge current $i_{stray}$ arising from a stray capacitance, e.g. within a larger circuit in which the first semiconductor switching circuit 70 is incorporated (e.g. as shown in FIG. 2(*a*)), to be diverted to flow through the first alternative current path 32 created by switching on the auxiliary semiconductor switching element 72 in the first auxiliary current branch 76. Such diverted stray capacitance discharge current $i_{stray}$ is then largely or completely discharged via the current limiting element 44, i.e. resistor 46, connected in series with the transistor 34 in the first auxiliary current branch 76.

Figure 2B:
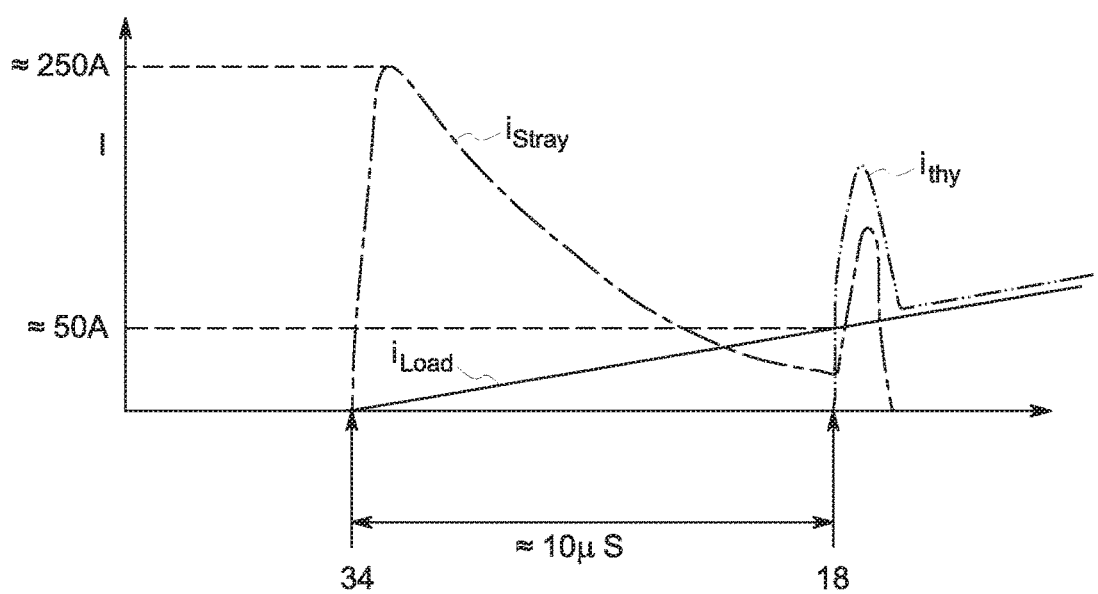

Such discharging of the stray capacitance discharge current $i_{stray}$ as the main thyristor 18 is switched on reduces the rate of change of current $i_{thy}$ which flows through the main thyristor 18 when it conducts current, i.e. immediately after the main thyristor 18 receives a turn-on signal and is switched on, as shown schematically in FIG. 2(b).

Such a reduction in the rate of change of current experienced by the main thyristor 18 as it is switched on means that a much smaller saturating inductor can be used in conjunction with the main thyristor 18 than would otherwise be the case.

There is a trade off between selecting the value of the current limiting resistor 46 and choosing the time delay before the main thyristor 18 is switched on: a low value of current limiting resistor 46 allows the time delay to be short, and hence the load current $i_{load}$ (which typically is rising at about 5 A/µs) will not have risen too much by the time the main thyristor 18 is fully turned on. However, a low value of current limiting resistor 46 requires a higher peak current rating for the transistor 34.

In other embodiments of the invention the control unit 30 may be similarly configured to switch on the transistor 34 in the auxiliary semiconductor switching element 72 in response to generation of a turn-on signal for the main thyristor 18, but such that the transistor 34 is switched on at the same time as the main thyristor 18 is switched on. In such other embodiments the corresponding transistor in the auxiliary semiconductor switching element would need to have a relatively high pulse current rating of a few kA, but only a modest average current rating of a few amps.

In any event, in the embodiments shown, once the stray capacitance discharge current $i_{stray}$ has been suitably discharged the transistor 34 is switched off and the first alternative current path 32 closed. In other embodiments, however, the auxiliary semiconductor switching element may be left simply to turn off naturally.

In another embodiment of the invention the IGBT transistor 34 may be substituted for a JFET in constant-current connection so that the stray capacitance discharge current $i_{stray}$ discharges in a linear fashion (rather than by exponential decay as shown in FIG. 2(b)) without requiring a current limiting resistor 46.

In a still further embodiment of the invention the current limiting element 44, i.e. resistor 46, may be dispensed with so that the transistor 34 in the auxiliary semiconductor switching element 72 carries the whole of the stray capacitance discharge current $i_{stray}$ and load current $i_{load}$ that the main thyristor 18 would otherwise have experienced had it turned on first. In such an embodiment the transistor 34 must have a pulse current rating of at least 1000 A, and possibly even as high as 5 kA or 10 kA. While such a current rating limits the choice of available transistors, silicon carbide based transistors are expected to become available in the foreseeable future with these performance characteristics.

Returning to the first semiconductor switching circuit 70 shown in FIG. 1, the control unit 30 is still further configured to switch on the single auxiliary semiconductor switching element 72 when the rate of change of voltage appearing across the main thyristor 18 exceeds a predetermined threshold.

Such switching of the parallel connected auxiliary semiconductor switching element 72, i.e. switching on of the transistor 34 therein, places the current limiting resistor 46 directly across the main thyristor 18 which slows down the rise of voltage across the main thyristor 18, and hence reduces the rate of change of voltage appearing across the main thyristor 18.

A first predetermined threshold is configured for operating conditions that the main thyristor 18 is specified to withstand (without some other protection of the main thyristor 18 coming into play), e.g. the switching on of another main semiconductor switching element which forms part of a 6-pulse group in a HVDC power converter when a surge arrestor connected in parallel with that other main semiconductor switching element is carrying current. Under such circumstances the auxiliary semiconductor switching element 72 is switched on during a period of high rate of change of voltage across the main thyristor 18 and is turned off again without the main thyristor 18 being turned on.

A second predetermined threshold is configured for operating conditions where protective firing of the main thyristor 18 is permitted, e.g. when handling a steep-front impulse. Under such circumstances the auxiliary semiconductor switching element 72 is switched on simultaneously with the main thyristor 18 but because the turn-on delay time of the auxiliary semiconductor switching element 72 (i.e. the transistor 34 included therein) is less than that of the main thyristor 18, the auxiliary semiconductor switching element 72, and more particularly the current limiting resistor 46 therein, acts to hold down the voltage across the main thyristor 18 during the first 0.5 µs or so.

In embodiments in which it is intended only to implement the second predetermined threshold a fast auxiliary thyristor 82 (which similarly has a relatively high pulse current rating) may be used in the auxiliary semiconductor switching element 72 instead of the transistor 34.

Figure 3:
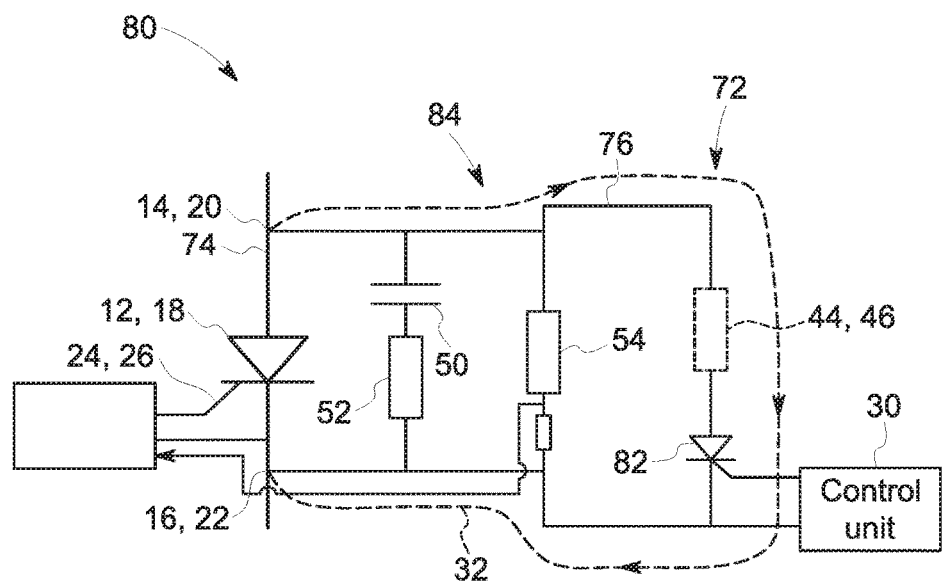
FIG. 3 shows a schematic view of a semiconductor switching circuit according to a second embodiment of the invention.

In another semiconductor switching circuit 80 according to a second embodiment of the invention, as illustrated schematically in FIG. 3, the transistor 34 and corresponding anti-parallel diode 42, and the series connected diode 48, of the auxiliary semiconductor switching element 72 may be replaced by an auxiliary thyristor 82. Typically such an auxiliary thyristor 82 would have an off-state voltage rating of 8 kV to 10 kV; a 500 A, 10 µs repetitive pulse current rating; a 5 kA, 10 µs single-shot pulse current rating; and a 1000 A/µs rate of change of current rating. The auxiliary thyristor 82 might also be of a gate turn off (GTO) type. Remaining features of the second semiconductor switching circuit 80 that are similar to those of the first semiconductor switching circuit 70 share the same reference numeral.

The main and auxiliary current branches 74, 76 included in the second semiconductor switching circuit 80 together define a second semiconductor switching assembly 84 which may be operated at least in the same way as the first semiconductor switching assembly 78 mentioned above, in order to reduce the rate of change of current flowing through the main thyristor 18 as it is switched on as well as, optionally, to reduce the rate of change of voltage across the main thyristor 18 when it experiences a high rate of change of voltage.

A semiconductor switching string (not shown) according to a further embodiment of the invention may include a plurality of series connected first or second semiconductor switching assemblies 78; 84 as described hereinabove.

Figure 4:
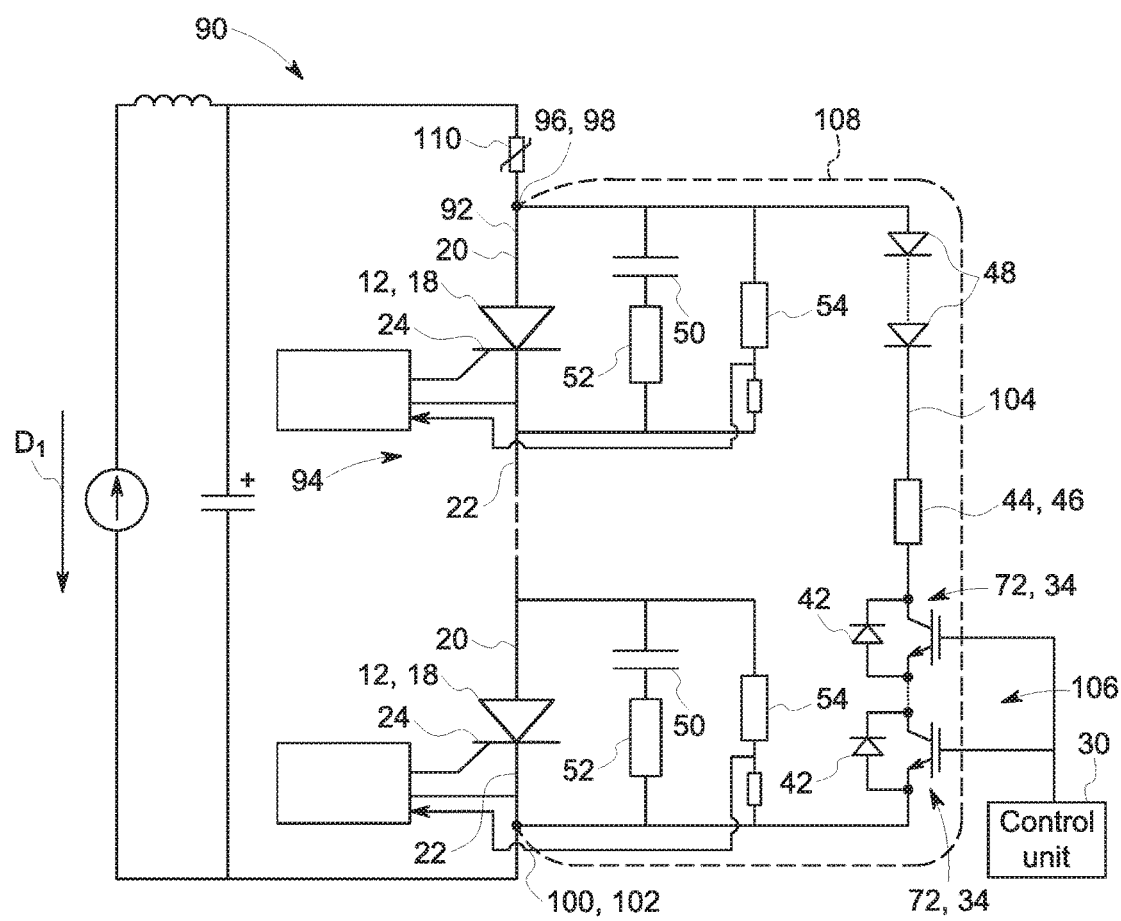
FIG. 4 shows a schematic view of a semiconductor switching circuit according to a third embodiment of the invention.

A semiconductor switching circuit 90 according to a third embodiment of the invention is shown schematically in FIG. 4. The third semiconductor switching circuit 90 shares similar features with the first and second semiconductor switching circuits 70; 80 and these similar features are identified by the same reference numeral.

The third semiconductor switching circuit 90 includes a second main current branch 92 which has a main string 94 of series-connected main semiconductor switching elements 12 (only two shown in FIG. 4), each of which is a main thyristor 18. Each such main thyristor 18 has a damping circuit (which includes a damping capacitor 50 and a damping resistor 52), as well as a further resistor 54, i.e. a DC grading resistor, connected in parallel therewith.

Meanwhile the main string 94 has an upstream connection terminal 96 at an upstream end 98 thereof and a downstream connection terminal 100 at a downstream end 102 thereof. In addition the third semiconductor switching circuit 90 includes a second auxiliary current branch 104 which is connected between the upstream and downstream connection terminals 96, 100 of the main string 94.

The second auxiliary current branch 104 includes an auxiliary string 106 of series-connected auxiliary semiconductor switching elements 72, each of which is a transistor 34 in the form of an n-channel insulated-gate bipolar transistor (IGBT), although many other transistors and/or thyristors may also be used. The transistors 34 share a common control unit 30 which they are each operatively connected with. In other embodiments of the invention several or all of the series-connected auxiliary semiconductor switching elements 72 in the auxiliary string 106 may have its own individual corresponding control unit.

Each transistor 34 has an anti-parallel diode 42 connected thereacross which protects the corresponding transistor 34 from reverse voltages while the second main current branch 92, i.e. each of the main semiconductor switching elements 12 therein, is reverse-biased. In other embodiments of the invention (not shown) each separate anti-parallel diode 42 could be omitted and instead use made of an intrinsic body-diode which is included within some transistors.

The second auxiliary current branch 104 also includes an optional current limiting element 44, in the form of a resistor 46, which is connected in series with the auxiliary string 106 of series-connected auxiliary semiconductor switching elements 72, i.e. with the auxiliary string 106 of series-connected transistors 34.

The second auxiliary current branch 104 also additionally includes a plurality of further, series-connected diodes 48 which are arranged to permit the flow of current through a second alternative current path 108 defined by the second auxiliary current branch 104 in the same direction as through the plurality of series-connected transistors 34, i.e. in the first direction $D_1$. The further, series-connected diodes 48 are included, in conjunction with the respective anti-parallel diodes 42, to protect each of the transistors 34 from a reverse voltage while the second main current branch 92, i.e. each main thyristor 18 therein, is reverse-biased. In this regard, the second auxiliary current branch 104 includes the same number of series-connected diodes 48 as it does auxiliary semiconductor switching elements 72 so as to help ensure such protection is adequate, although fewer than or more than the same number of series-connected diodes may be used in other embodiments of the invention.

The control unit 30 is configured to switch on the auxiliary semiconductor switching elements 72 as each of the main thyristors 18 is switched on.

More particularly, the control unit 30 is configured to switch on the transistors 34 in the auxiliary current branch 104 in response to generation of a turn-on signal for the main thyristors 18. In this way each of the transistors 34 can be switched on at the same time about 10 to 20 μs before the main thyristors 18 are all switched on.

As a result any stray capacitance discharge current $i_{stray}$ arising from a stray capacitance, e.g. within a larger circuit in which the third semiconductor switching circuit 90 is incorporated, is diverted to flow through a second alternative current path 108 created by switching on each of the auxiliary semiconductor switching elements 72 in the second auxiliary current branch 104. Such diverted stray capacitance discharge current $i_{stray}$ is again then largely or completely discharged via the current limiting element 44, i.e. resistor 46, connected in series with the auxiliary string 106 of series-connected auxiliary semiconductor switching elements 72 in the second auxiliary current branch 104.

Such discharging of the stray capacitance discharge current $i_{stray}$ before the main thyristors 18 are switched on reduces the rate of change of current $i_{thy}$ which flows through each such main thyristor 18 when it conducts current, i.e. immediately after it is switched on.

Such a reduction in the rate of change of current experienced by each main thyristor 18 means that a much smaller saturating inductor 110 can be used in conjunction with the second main current branch 92 than would otherwise be the case.

In addition the control unit 30 (or plurality of control units in embodiments including such multiple individual control units) may be configured to switch on the transistors 34 in the auxiliary current branch 104 when the rate of change of voltage appearing across a first one of the main semiconductor switching elements 12, i.e. across a first one of the main thyristors 18, exceeds a predetermined threshold. In this way the or each control unit is able additionally to reduce the rate of change of voltage appearing across the said first main thyristor 18 as well as across each of the other main thyristors 18 in the second main current branch 92.

The invention claimed is:

1. A semiconductor switching circuit, for use in a HVDC power converter, comprising:
    a main current branch including at least one main semiconductor switching element and through which current flows in a first direction when the or each main semiconductor switching element is switched on; and
    an auxiliary current branch connected in parallel with the main current branch and the or each main semiconductor switching element included therein, the auxiliary current branch including at least one auxiliary semiconductor switching element, the or each auxiliary semiconductor switching element having a control unit operatively connected therewith, the or each control unit being configured to switch on the or each auxiliary semiconductor switching element in the auxiliary current branch as the or each main semiconductor switching element is switched on to selectively create an alternative current path via the auxiliary current branch whereby stray capacitance discharge current flowing in the first direction through the main current branch is diverted to flow through the alternative current path to reduce the rate of change of discharge current flowing through the or each main semiconductor switching element when the or each said main semiconductor switching element is first switched on and exposed to a large change in current.

2. A semiconductor switching circuit according to claim 1 wherein the or each control unit is configured to switch on the or each auxiliary semiconductor switching element in response to generation of a turn-on signal for the or each main semiconductor switching element.

3. A semiconductor switching circuit according to claim 1 wherein the or each control unit is configured subsequently to switch the or each auxiliary semiconductor switching element off to control the amount of current diverted to flow through the alternative current path.

4. A semiconductor switching circuit according to claim 1 wherein the or each auxiliary semiconductor switching element is or includes a transistor.

5. A semiconductor switching circuit according to claim 1 wherein the or each auxiliary switching element is or includes a thyristor.

6. A semiconductor switching circuit according to claim 1 wherein the auxiliary current branch includes a current limiting element connected in series with the or each auxiliary semiconductor switching element.

7. A semiconductor switching circuit according to claim 1 wherein the or each control unit is configured to switch on the or each auxiliary semiconductor switching element to selectively create an alternative current path via the auxiliary current branch whereby current flowing in the first direction through the main current branch is diverted to flow through the alternative current path to reduce the rate of change of voltage appearing across the or each main semiconductor switching element.

8. A semiconductor switching circuit according to claim 7 wherein the or each control unit is configured to switch on the or each auxiliary semiconductor switching element when the rate of change of voltage appearing across one or more main semiconductor switching elements exceeds a predetermined threshold to reduce the rate of change of voltage appearing across the or each main semiconductor switching element.

9. A semiconductor switching circuit according to claim 1 wherein the or each control unit is configured to switch on the or each auxiliary semiconductor switching element in the auxiliary current branch at the same time as the or each main semiconductor switching element is switched on.

10. A semiconductor switching circuit according to claim 1 wherein the or each control unit is configured to switch on the or each main semiconductor switching element in the auxiliary current branch just before the or each main semiconductor switching element is switched on.

11. A semiconductor switching circuit according to claim 1 wherein the main current branch includes a single main semiconductor switching element having first and second connection terminals and the auxiliary current branch is connected between the first and second connection terminals whereby the main and auxiliary current branches together define a semiconductor switching assembly.

12. A semiconductor switching circuit according to claim 11 wherein the auxiliary current branch includes a single auxiliary semiconductor switching element.

13. A semiconductor switching circuit according to claim 11 wherein the auxiliary current branch includes a plurality of series-connected auxiliary semiconductor switching elements.

14. A semiconductor switching circuit according to claim 1 wherein the main current branch includes a main string of series-connected main semiconductor switching elements, the main string having an upstream connection terminal at an upstream end thereof and a downstream connection terminal at a downstream end thereof, the auxiliary current branch is connected between the upstream and downstream connection terminals of the main string, and the auxiliary current branch includes an auxiliary string of series-connected auxiliary semiconductor switching elements.

15. A semiconductor switching string, for use in a HVDC power converter, comprising:
 a plurality of series-connected semiconductor switching assemblies, each of the plurality of series-connected semiconductor switching assemblies comprising:
  a main current branch including at least one main semiconductor switching element and through which current flows in a first direction when the or each main semiconductor switching element is switched on; and
  an auxiliary current branch connected in parallel with the main current branch and the or each main semiconductor switching element included therein, the auxiliary current branch including at least one auxiliary semiconductor switching element, the or each auxiliary semiconductor switching element having a control unit operatively connected therewith, the or each control unit being configured to switch on the or each auxiliary semiconductor switching element in the auxiliary current branch as the or each main semiconductor switching element is switched on to selectively create an alternative current path via the auxiliary current branch whereby stray capacitance discharge current flowing in the first direction through the main current branch is diverted to flow through the alternative current path to reduce the rate of change of discharge current flowing through the or each main semiconductor switching element immediately after when the or each said main semiconductor switching element is first switched on and exposed to a large change in current;
 wherein, for each of the plurality of series-connected semiconductor switching assemblies, the main current branch includes a single main semiconductor switching element having first and second connection terminals and the auxiliary current branch is connected between the first and second connection terminals whereby the main and auxiliary current branches together define a semiconductor switching assembly.

16. A semiconductor switching string according to claim 11 wherein, for each of the plurality of series-connected semiconductor switching assemblies, the auxiliary current branch includes a single auxiliary semiconductor switching element.

17. A semiconductor switching string according to claim 11 wherein, for each of the plurality of series-connected semiconductor switching assemblies, the auxiliary current branch includes a plurality of series-connected auxiliary semiconductor switching elements.

* * * * *